(12) United States Patent
Cunningham et al.

(10) Patent No.: US 11,774,851 B2
(45) Date of Patent: *Oct. 3, 2023

(54) METHODS AND APPARATUS FOR CREATING A LARGE AREA IMPRINT WITHOUT A SEAM

(71) Applicant: Applied Materials, Inc., Santa Clara, CA (US)

(72) Inventors: Kevin Laughton Cunningham, Belmont, CA (US); Manivannan Thothadri, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 271 days.

This patent is subject to a terminal disclaimer.

(21) Appl. No.: 17/188,684

(22) Filed: Mar. 1, 2021

(65) Prior Publication Data

US 2021/0181625 A1 Jun. 17, 2021

Related U.S. Application Data

(63) Continuation of application No. 15/924,763, filed on Mar. 19, 2018, now Pat. No. 10,948,818.

(51) Int. Cl.
*G03F 7/00* (2006.01)
*B29C 33/38* (2006.01)
(Continued)

(52) U.S. Cl.
CPC ........ *G03F 7/0002* (2013.01); *B29C 33/3878* (2013.01); *B29C 33/40* (2013.01);
(Continued)

(58) Field of Classification Search
CPC ............ B29C 33/3878; B29C 33/3885; B29C 33/3892; G03F 7/0002
See application file for complete search history.

(56) References Cited

U.S. PATENT DOCUMENTS

| 8,361,371 B2 | 1/2013 | Khusnatdinov et al. |
| 10,175,572 B2 | 1/2019 | Jung |

(Continued)

FOREIGN PATENT DOCUMENTS

| CN | 105974732 A | 9/2016 |
| KR | 10-20080105524 A | 12/2008 |

(Continued)

OTHER PUBLICATIONS

Korean Office Action, dated Jul. 25, 2022, for Korean Patent Application 10-2020-7029704.

(Continued)

*Primary Examiner* — Xiao S Zhao
*Assistant Examiner* — John J DeRusso
(74) *Attorney, Agent, or Firm* — Patterson + Sheridan, LLP

(57) ABSTRACT

Embodiments of the present disclosure generally relate to imprint lithography, and more particularly to methods and apparatus for creating a large area imprint without a seam. Methods disclosed herein generally include separating the curing time of the features in a stamp or product from the curing time of the seam and the periphery. The seam and periphery can be cured first or the seam and periphery can be cured last. Additionally, the seam curing operations can be performed on the master, on the stamp, or on the final product.

20 Claims, 6 Drawing Sheets

(51) Int. Cl.
*B29C 33/40* (2006.01)
*B29C 43/02* (2006.01)
*G03F 7/20* (2006.01)
*B29C 43/38* (2006.01)
*B82Y 40/00* (2011.01)
*G03F 7/30* (2006.01)

(52) U.S. Cl.
CPC .............. *B29C 43/02* (2013.01); *B29C 43/38* (2013.01); *B82Y 40/00* (2013.01); *G03F 7/2002* (2013.01); *G03F 7/30* (2013.01); *B29K 2909/02* (2013.01); *B29K 2995/0027* (2013.01)

(56) References Cited

U.S. PATENT DOCUMENTS

| | | | |
|---|---|---|---|
| 10,948,818 B2 * | 3/2021 | Cunningham | G03F 7/2002 |
| 2003/0138704 A1 | 7/2003 | Mei et al. | |
| 2008/0299467 A1 | 12/2008 | Kim et al. | |
| 2011/0284499 A1 | 11/2011 | Suehira et al. | |
| 2012/0004917 A1 | 1/2012 | Hung | |
| 2012/0049417 A1 | 3/2012 | Inanami | |
| 2013/0078821 A1 * | 3/2013 | Furutono | G03F 7/0002 264/447 |
| 2014/0027955 A1 * | 1/2014 | Wakabayashi | G03F 7/00 264/447 |
| 2015/0138522 A1 | 5/2015 | Ito et al. | |
| 2016/0054498 A1 | 2/2016 | Chung et al. | |
| 2018/0046075 A1 | 2/2018 | Han et al. | |
| 2018/0210352 A1 | 7/2018 | Jung | |

FOREIGN PATENT DOCUMENTS

| | | |
|---|---|---|
| KR | 10-20100123698 A | 11/2010 |
| KR | 10-20160024410 A | 3/2016 |
| KR | 1780729 | 9/2017 |
| KR | 10-20180018890 A | 2/2018 |
| KR | 20180024203 | 3/2022 |
| WO | 2017032758 A1 | 3/2017 |

OTHER PUBLICATIONS

Japanese Office Action, dated Aug. 24, 2021, for Japanese Patent Application 2020-549759.
TW OA dated Dec. 20, 2019 for Application No. 108105580.
International Search Report dated May 28, 2019 for Application No. PCT/US2019/018479.
Korean Office Action for Korean Application No. 10-2020-7029704, dated Mar. 29, 2023.

* cited by examiner

METHODS AND APPARATUS FOR CREATING A LARGE AREA IMPRINT WITHOUT A SEAM

CROSS-REFERENCE TO RELATED APPLICATIONS

This application is a continuation of U.S. patent application Ser. No. 15/924,763, filed Mar. 19, 2018, which herein is incorporated by reference.

BACKGROUND

Field

Embodiments of the present disclosure generally relate to imprint lithography, and more particularly to methods and apparatus for creating a large area imprint without a seam.

Description of the Related Art

Imprint lithography is a contact patterning method that can be used to fabricate nanometer scale patterns. Generally, imprint lithography begins by creating a template of a pattern. A liquid, such as a photoresist, is deposited on the substrate to be patterned. Then, the patterned template is pressed against the liquid to imprint the pattern on the substrate. The patterned substrate is then cured to solidify the patterning in the photoresist on the substrate.

However, conventional imprint lithography methods and apparatus have various challenges. For example, conventional imprint lithography methods are not suitable for large area substrates (greater than 300 mm), such as display devices, because conventionally used masters are not large enough to pattern large area displays. As such, some conventional imprint methods have used multiple masters, which have been adhered to one another. However, a seam is formed between the masters and at the periphery, which is then transferred into the patterning on the substrate. The patterned irregularities at the seams and periphery can cause decreased device efficiency and even device failure. For example, in the case of a light guided panel (LGP), when a seam is imprinted into the LGP, it becomes a surface feature that could direct or out-couple light out of the LGP. In the case of liquid crystal display (LCD), when a seam is imprinted into the LCD, the viewer will see the seam in the display.

Therefore, there is a need for improved imprint lithography methods and apparatus that can be used to imprint large area substrates.

SUMMARY

Embodiments of the present disclosure generally relate to imprint lithography, and more particularly to methods and apparatus for creating a large area imprint without a seam. Methods disclosed herein generally include separating the curing time of the features in a stamp or product from the curing time of the seam and the periphery. The seam and periphery can be cured first or the seam and periphery can be cured last. Additionally, the seam curing operations can be performed on the master, on the stamp, or on the final product.

In one embodiment, an imprint lithography method is disclosed. The method includes imprinting a stamp material with a plurality of masters adhered to a backing plate to form a stamp, each master having a plurality of features thereon, and each pair of the plurality of masters having a seam therebetween, positioning a mask between an ultraviolet light source and the stamp material, and exposing the stamp material to ultraviolet light from the ultraviolet light source to form cured portions and uncured portions of the stamp material.

In another embodiment, an imprint lithography method is disclosed. The method includes imprinting a stamp material with a plurality of masters adhered to a backing plate to form a stamp, each master having a plurality of features thereon, and each pair of the plurality of masters having a seam therebetween, imprinting a photoresist material on a substrate with the stamp, positioning a mask between an ultraviolet light source and the photoresist material, and exposing the photoresist material to ultraviolet light from the ultraviolet light source to form cured portions and uncured portions of the photoresist material.

In yet another embodiment, an imprint lithography method is disclosed. The method includes adhering a plurality of masters to a backing plate, each master having a plurality of features thereon, and each pair of the plurality of masters having a seam therebetween, filling the seam between each pair of the plurality of masters with a filler material, forming a stamp by imprinting a stamp material with the plurality of masters, imprinting a photoresist material over a substrate with the stamp, and removing the stamp from the imprinted photoresist material to form a final product having a positive image of the plurality of features and the filled seam thereon.

In yet another embodiment, an imprint lithography apparatus is disclosed. The apparatus includes a UV transparent backing plate and at least two masters coupled to the UV transparent backing plate, each of the at least two masters having a plurality of features thereon, and the at least two masters having a seam therebetween.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Embodiments of the present disclosure generally relate to imprint lithography, and more particularly to methods and apparatus for creating a large area imprint without a seam. Methods disclosed herein generally include separating the curing time of the features in a stamp or product from the curing time of the seam and the periphery. The seam and periphery can be cured first or the seam and periphery can be cured last. Additionally, the seam curing operations can be performed on the master, on the stamp, or on the final product.

The embodiments that follow will refer to methods and apparatus for creating a large area imprint without a seam. The embodiments are also useful to cure similar seam-like challenges at the periphery of the master, stamp or final product.

Figure 1A:
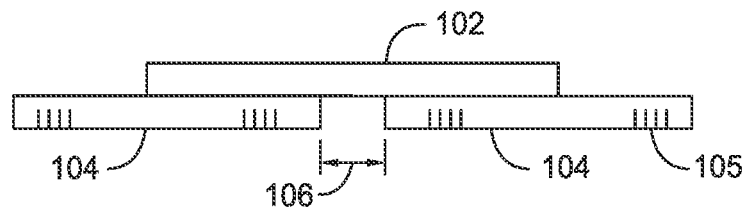
FIGS. 1A-1F depict various stages of a substrate patterning method according to embodiments disclosed herein.
Figure 1B:
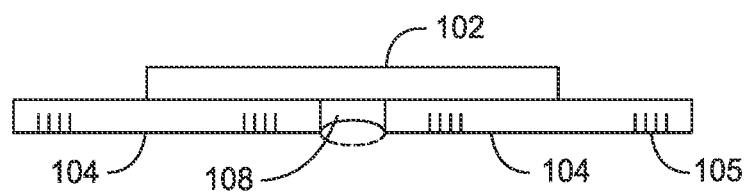

FIGS. 1A-1F depict various stages of a substrate patterning method according to embodiments disclosed herein. The method depicted in FIGS. 1A-1F provides a master-level solution to seam and periphery challenges. The method begins by adhering a plurality of masters 104 onto a backing plate 102. Two masters 104 are adhered to the backing plate 102 in the embodiment shown in FIG. 1A. The masters 104 have a pattern of features 105 thereon. A seam 106 is formed between the two masters 104. The seam 106 is filled with a filler material 108, as shown in FIG. 1B. Generally, the filler material 108 will not fill the seam 106 in a manner that results in a completely flat surface. Instead, if the seam 106 is underfilled with filler material 108, the seam 106 will become concave, as shown in FIG. 1B. In another embodiment, the seam 106 is overfilled with filler material 108 and becomes convex.

Figure 1C:
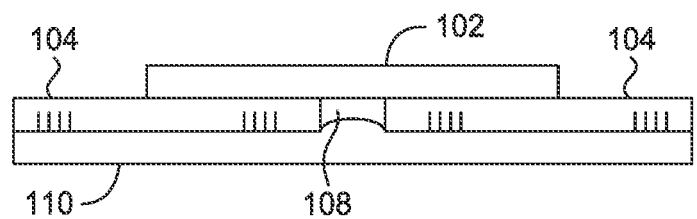
Figure 1D:
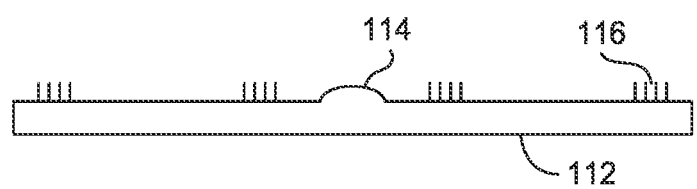
Figure 1E:
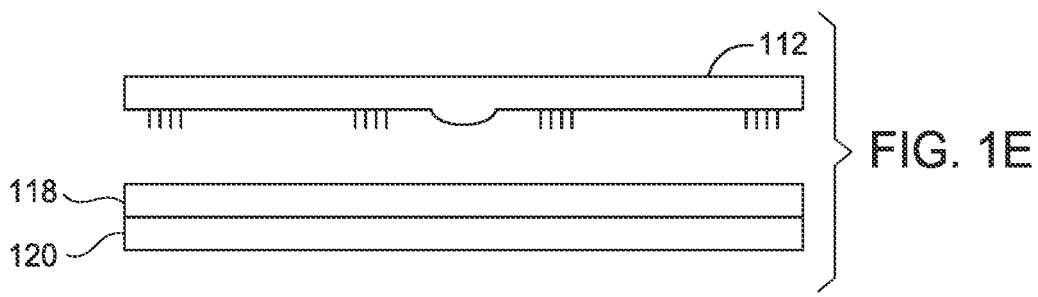
Figure 1F:
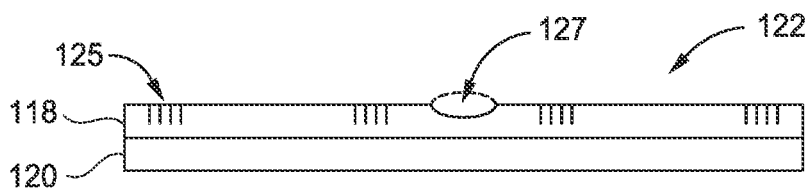

As shown in FIG. 1C, a stamp material 110 is contacted by the masters 104 to form a stamp 112. As shown in FIG. 1D, the stamp 112 is a negative pattern of the masters 104. As such, the stamp 112 includes a convex portion 114 at the position corresponding to the concave seam 106 and negative features 116. The stamp 112 is then used to pattern a photoresist material 118 which is deposited over a substrate 120, as shown in FIG. 1E, to form a final product 122, as shown in FIG. 1F. The final product 122 includes a photoresist material 118 which has been patterned with a plurality of features 125, as well as concave portion 127. Since the method includes two transfer imprints, at the stamp level and the final product level, the final product 122 is a positive image of the masters 104 and the seam 106.

The filler material 108 is generally any suitable material. In one example, the filler material 108 is a polymer. In another example, the filler material 108 is a low viscosity adhesive that is able to fill gaps or seams that are between about 100 μm and about 500 μm in width, such as a low viscosity silicone. In some examples, the filler material 108 is able to fill gaps or seams through capillary action. The stamp material 110 is generally any suitable material. In one example, the stamp material 110 is a polydimethyl siloxane material (PDMS), or any other variation to PDMS that has been spin coated or deposited on a substrate. In further examples, the stamp material 110 is any soft material that functions as an intermediate pattern transfer medium, such as polyvinyl alcohol (PVA) based. The substrate is generally any suitable substrate material, including but not limited to, glass, fused silica, quartz, poly(methyl methacrylate) (PMMA), polyethylene terephthalate (PET) and polycarbonate.

In further embodiments, the method includes fewer or additional operations to pattern the substrate. For example, in one embodiment, an additional transfer imprint operation is performed in order to make a negative image of the masters on the substrate. In another embodiment, the masters are used to pattern the substrate directly, and the intermediate transfer imprint operations are eliminated.

Figure 2A:
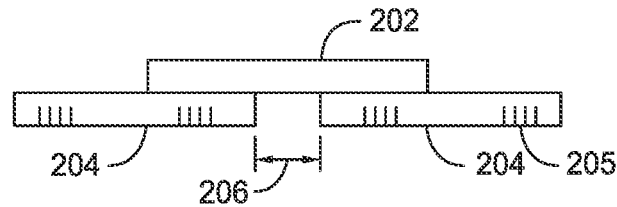
FIGS. 2A-2D depict various stages of a substrate patterning method according to embodiments disclosed herein.

FIGS. 2A-2D depict various stages of a substrate patterning method according to embodiments disclosed herein. The method depicted in FIGS. 2A-2D provides a stamp-level solution to seam and periphery challenges in which the seam and periphery are cured last. The method begins by adhering a plurality of masters 204 onto a backing plate 202. Two masters 204 are adhered to the backing plate 202 in the embodiment shown in FIG. 2A. The masters 204 have a pattern of features 205 thereon. A seam 206 is formed between the two masters 204. As shown in FIG. 2A, the seam 206 is left unfilled. In other embodiments, the seam 206 is underfilled such that the seam 206 is concave.

Figure 2B:
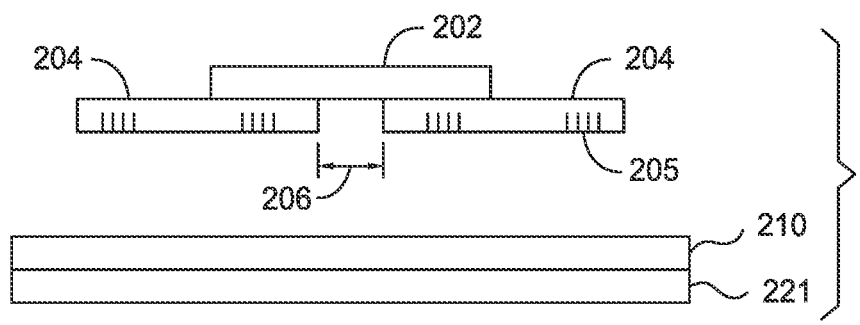
Figure 2C:
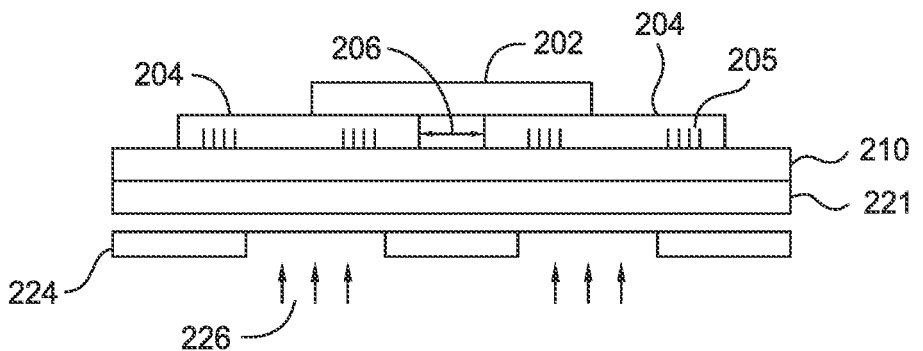

Next, shown in FIG. 2B, the masters 204 imprint a stamp material 210. After the masters 204 imprint the stamp material 210, a mask 224 is positioned between the stamp material 210 and an ultraviolet (UV) light source 226, as shown in FIG. 2C. In operation, the mask 224 prevents UV light from reaching the portion of the stamp material 210 corresponding to the seam 206. Since the UV light from the UV light source 226 does not reach the portion of the stamp material 210 corresponding to the seam 206, the seam 206 will be imprinted but not cured in the stamp material 210.

Figure 2D:
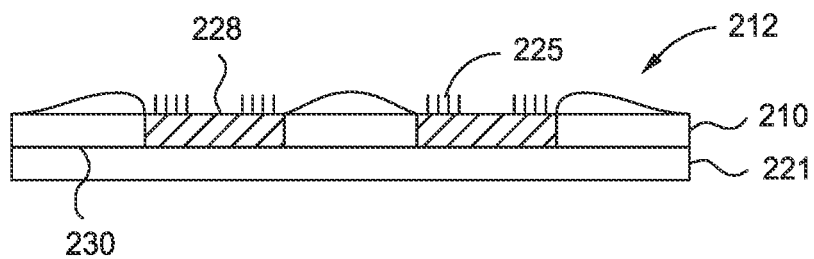

After the unmasked portions of the stamp material 210 have been cured, shown as cured portions 228 in FIG. 2D, the masters 204 are removed from the stamp material 210 and the uncured portions 230 (corresponding to the seam 206 and periphery) of the stamp material 210 flow or "relax" until the uncured portions 230 are flat along the surface of the substrate 221, as shown in FIG. 2D. After the uncured portions 230 have flowed and are flat along the surface of the substrate 221, the stamp material 210 is cured again with additional UV light to create a stamp 212 having features 225 thereon. The stamp 212 can be used to imprint a final product, such as a large area substrate, without leaving a seam in the final product.

The stamp material 210 is generally any suitable material. In one example, the stamp material 210 is a PDMS material. In another example, the soft stamp material 210 is made from PVA. The substrate 221 is generally any suitable substrate material, including but not limited to, glass, PMMA, and polycarbonate.

In another embodiment, the seam 206 is overfilled with a filler material, such as a polymer. As shown in FIGS. 2A-2D the stamp material 210 is deposited on a substrate 221; in further embodiments, however, the stamp material 210 is directly coated on the masters 204 and is later removed. In further embodiments, the uncured portions 230 are washed away instead of subsequently cured. For example, the uncured portions 230 may be removed using one or more solvents selected to remove the particular stamp material 210. Additionally, further embodiments contemplate using a maskless direct write laser system to cure predetermined portions of the material using a focused, narrow beam of radiation. For example, the maskless direct write system can be used to cure the regions with features during the imprint method. The maskless direct write laser system then also can be used to cure the seam and periphery regions after the masters have been removed.

In further embodiments, the method includes fewer or additional operations to pattern the substrate. For example, in one embodiment, an additional transfer imprint operation is performed in order to make a negative image of the masters on the substrate. In another embodiment, the masters are used to pattern the substrate directly and the intermediate transfer imprint operations are eliminated.

Figure 3A:
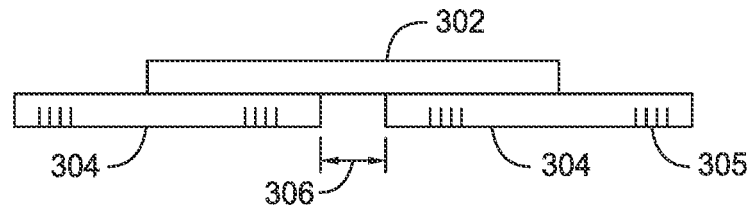
FIGS. 3A-3D depict various stages of a substrate patterning method according to embodiments disclosed herein.

FIGS. 3A-3D depict various stages of a substrate patterning method according to embodiments disclosed herein. The method depicted in FIGS. 3A-3D provides a stamp-level solution to seam and periphery challenges in which the seam and periphery are cured first. The method begins by adhering a plurality of masters 304 onto a backing plate 302. Two masters 304 are adhered to the backing plate 302 in the embodiment shown in FIG. 3A. The masters 304 have a pattern of features 305 thereon. A seam 306 is formed between the two masters 304. As shown in FIG. 3A, the seam 306 is left unfilled. In other embodiments, the seam 306 is underfilled such that the seam 306 is concave.

Figure 3B:
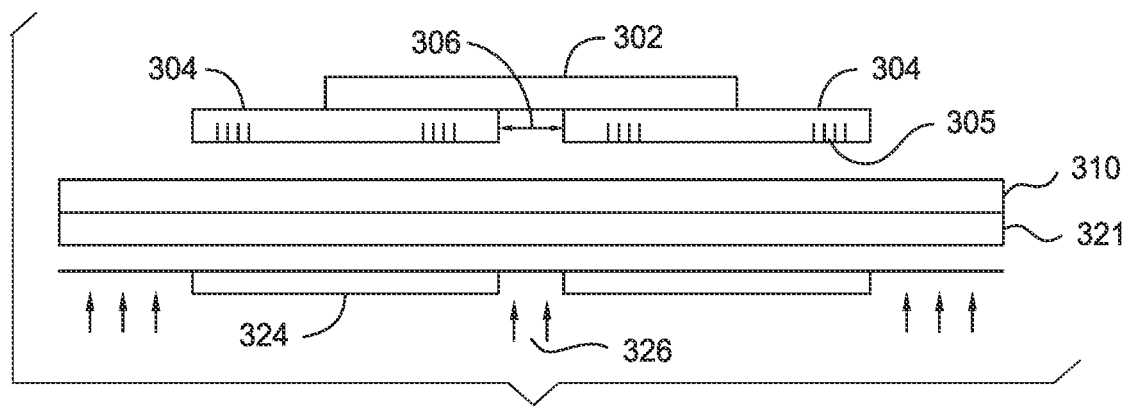
Figure 3C:
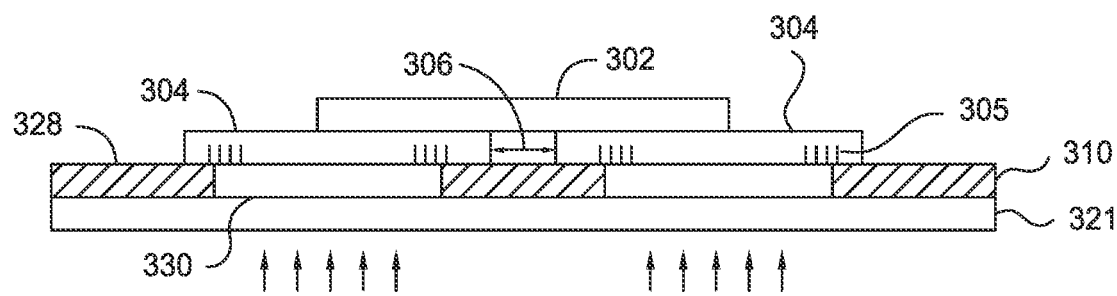
Figure 3D:
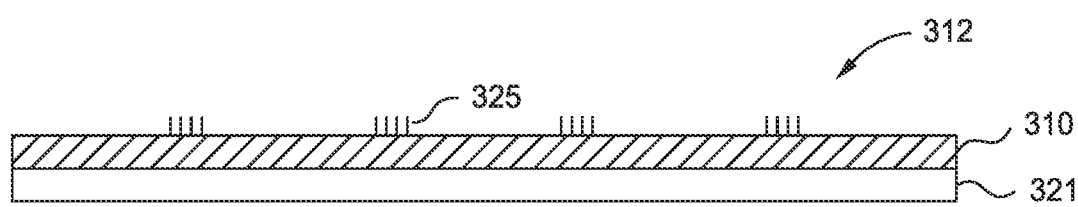

Next, a stamp material 310 deposited over a substrate 321 is cured. More particularly, a mask 324 is positioned between the stamp material 310 and a UV light source 326, as shown in FIGS. 3B-3C. In operation, the mask 324 prevents UV light from reaching the portions, shown as uncured portions 330, of the stamp material 310 that will be imprinted with the features 305. The unmasked portions of the stamp material 310 are cured, shown as cured portions 328. The cured portions 328 correspond to the areas of the seam 306 and periphery. The masters 304 then imprint the uncured portions 330 of the stamp material 310 while the cured portions 328 are not imprinted, as shown in FIG. 3C. After being imprinted, the imprinted uncured portions 330 are cured. The masters 304 and backing plate 302 are then removed to form a stamp 312 having features 325 thereon, as shown in FIG. 3D. The stamp 312 can be used to imprint a final product, such as a large area substrate, without leaving a seam in the final product.

The stamp material 310 is generally any suitable material. In one example, the stamp material 310 is a PDMS material. The substrate 321 is generally any suitable substrate material, including but not limited to, glass, PMMA, and polycarbonate.

In another embodiment, the seam 306 is overfilled with a filler material, such as a polymer. Further embodiments contemplate using a maskless direct write laser system to cure the regions with features before the imprint operations. For example, the maskless direct write laser system is used to cure the seam 306 and periphery regions before the masters 304 have imprinted the stamp material 310. Additionally, the maskless direct write laser system can be used to cure the rest of the stamp material 310 after the stamp material 310 has been imprinted by the masters 304.

Figure 4A:
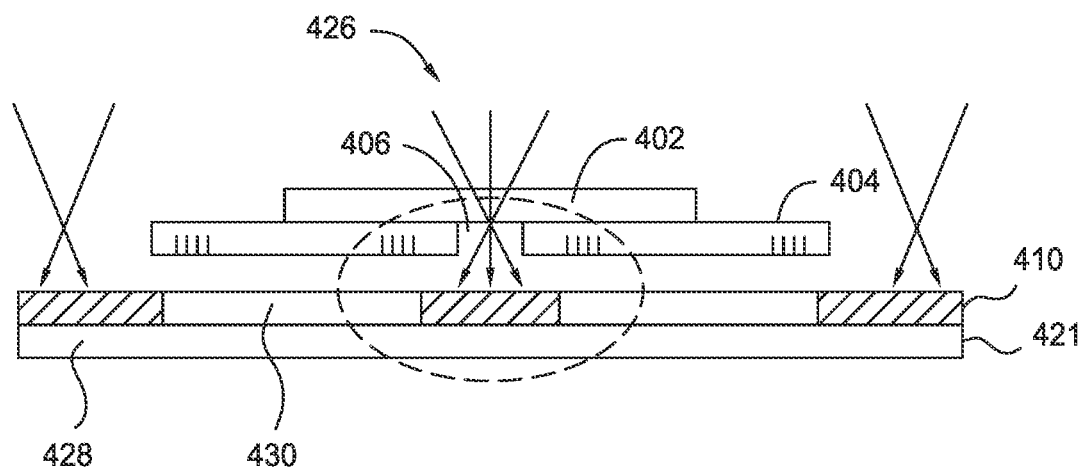
FIGS. 4A-4B depict various stages of a substrate patterning method according to embodiments disclosed herein.
Figure 4B:
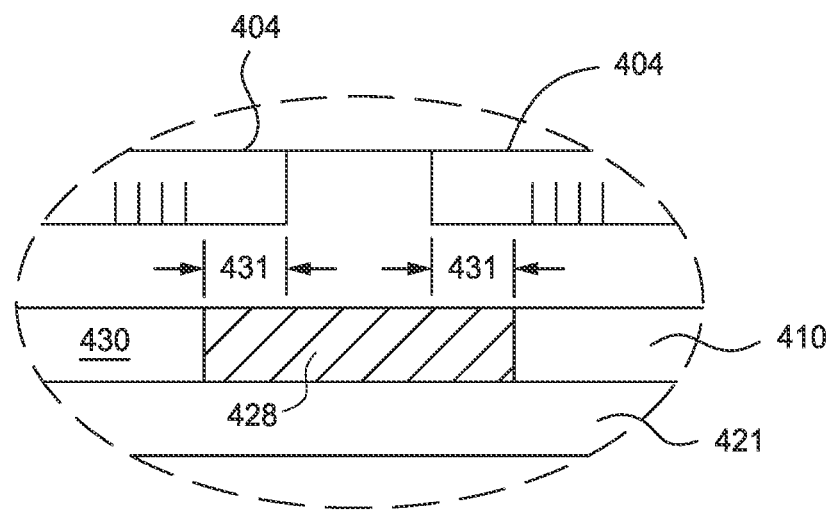

As shown in FIGS. 3B-3C, the UV light source 326 is positioned below the stamp material 310. However, in the embodiment shown in FIG. 4A, a UV light source 426 is positioned above the backing plate 402, the masters 404 and the stamp material 410. In this embodiment, the masters 404 operate as a self-aligned mask such that the UV light does not reach the portions of the stamp material 410 that are below the masters 404, as shown by uncured portions 430. Accordingly, the backing plate 402 comprises any suitable material that is transparent to the wavelength of the UV light being used for curing. Suitable backing plate materials include, but are not limited to, glass, quartz, sapphire and fused silica. As shown in FIG. 4B, depending on the angle of the UV light, a region of the stamp material 410 that is cured is generally slightly larger than the seam 406 to improve the mechanical stability of the imprinted stamp. Stated differently, there is generally an overlapping region 431 at the edges of the masters 404 such that the region of the stamp material 410 thereunder is cured. Other methods and configurations are also contemplated to obtain a slight overlap between cured region of the stamp material 410 and the masters 404. The size of the overlapping region 431 is generally selected based on the flexure of the cured regions and the masters 404 to minimize the impact on the pattern of features 405, while also achieving seamless or nearly seamless transfer.

The overlapping region 431 is useful to remove or reduce a small step-height at the end of the seam 406 that may result when the masters 404 transfer the pattern of features 405 into the stamp material 410. After the operation shown in FIG. 4B, subsequent imprint steps are used to transfer the pattern on the masters 404 to the stamp material 410, which is then cured.

Figure 5A:
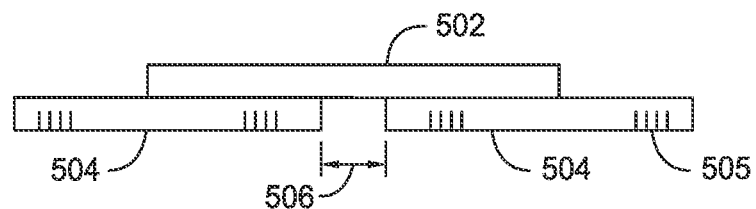
FIGS. 5A-5F depict various stages of a substrate patterning method according to embodiments disclosed herein.
Figure 5B:
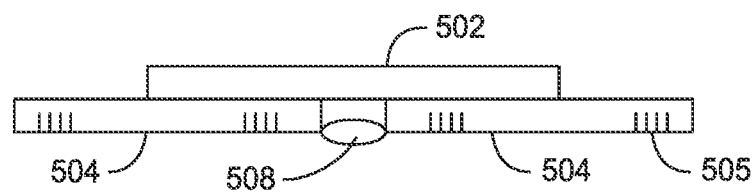

FIGS. 5A-5F depict various stages of a substrate patterning method according to embodiments disclosed herein. The method depicted in FIGS. 5A-5F provides a product-level solution to seam and periphery challenges in which the seam and periphery are cured last. The method begins by adhering a plurality of masters 504 onto a backing plate 502. Two masters 504 are adhered to the backing plate 502 in the embodiment shown in FIG. 5A. The masters 504 have a pattern of features 505 thereon. A seam 506 is formed between the two masters 504. The seam 506 is filled with a filler material 508, as shown in FIG. 5B. Generally, the filler material 508 will not fill the seam 506 in a manner that produces a completely flat surface. Instead, if the seam 506 is overfilled with filler material 508, the filled seam 506 will become convex, as shown in FIG. 5B. In another embodiment, the filled seam 506 is underfilled with filler material 508 and becomes concave.

Figure 5C:
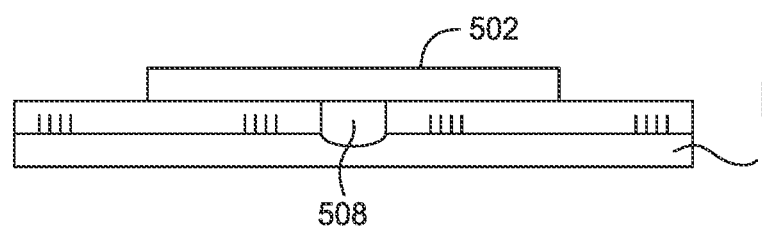
Figure 5D:
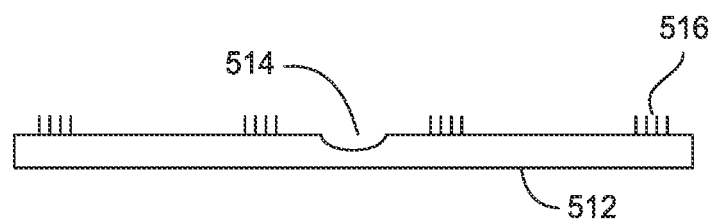
Figure 5E:
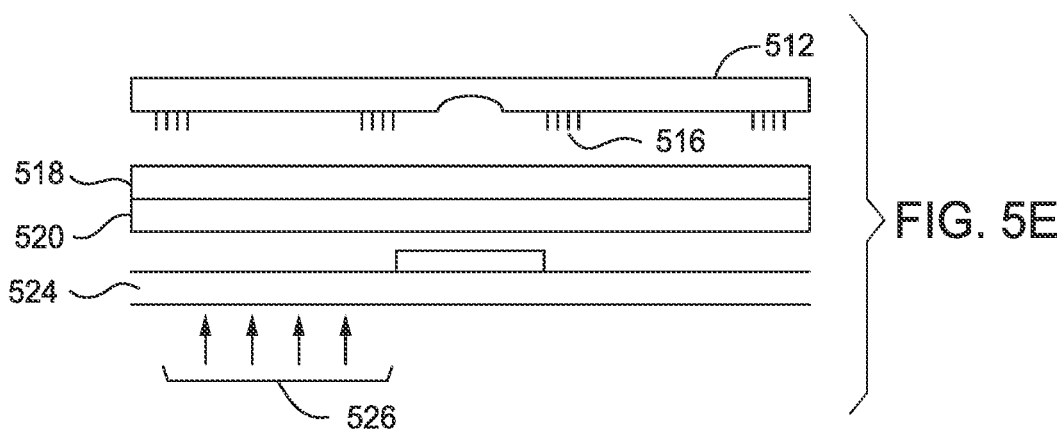
Figure 5F:
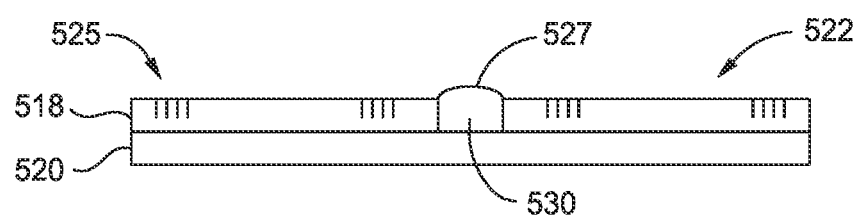

As shown in FIG. 5C, a stamp material 510 is contacted by the masters 504 to form a stamp 512. As shown in FIG. 5D, the stamp 512 is a negative pattern of the masters 504. As such, the stamp 512 includes a concave portion 514 at the position corresponding to the convex seam 506 and negative features 516. The stamp 512 is then used to pattern a photoresist material 518 which is deposited over a substrate 520. As shown in FIG. 5E, a mask 524 is positioned between the stamp 512 and a UV light source 526. In operation, the mask 524 prevents UV light from reaching the seam 506 and periphery of the stamp 512, as shown by uncured portion 530, such that the seam and periphery are imprinted, but not cured. The stamp 512 is then removed and a final product 522 is formed, as shown in FIG. 5F. The final product 522 includes uncured portion 530 that flows or "relaxes" until the uncured portion 530 is flat along the surface of the substrate 521. After the uncured portion 530 has flowed and is flat on the surface of the substrate 521, the final product 522 is cured again with additional UV light to create a final product 522 having features 525 thereon that is without a seam.

As shown in FIGS. 5A-5F the photoresist material 518 is deposited on a substrate 520; in further embodiments, however, the photoresist material 518 is directly coated on the stamp 512 and is later removed. In further embodiments, the uncured portion 530 may be washed away instead of subsequently cured. Additionally, further embodiments contemplate using a maskless direct write laser system to cure the regions with features during the imprint method.

Figure 6A:
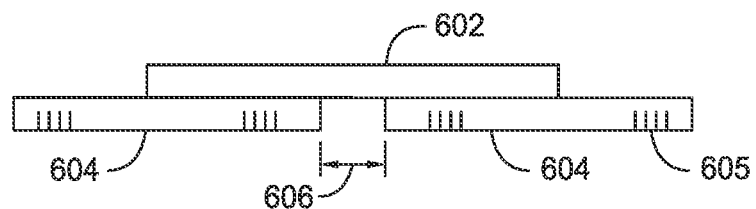
FIGS. 6A-6F depict various stages of a substrate patterning method according to embodiments disclosed herein.
Figure 6B:
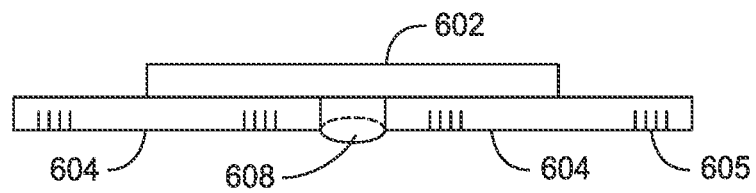

FIGS. 6A-6F depict various stages of a substrate patterning method according to embodiments disclosed herein. The method depicted in FIGS. 6A-6F provides a product-level solution to seam and periphery challenges in which the seam and periphery are cured first. The method begins by adhering a plurality of masters 604 onto a backing plate 602. Two masters 604 are adhered to the backing plate 602 in the embodiment shown in FIG. 6A. The masters 604 have a pattern of features 605 thereon. A seam 606 is formed between the two masters 604. The seam 606 is filled with a filler material 608, as shown in FIG. 6B. Generally, the filler material 608 will not fill the seam 606 in a manner that provides a completely flat surface. Instead, if the seam 606 is overfilled with filler material 608, the filled seam 606 will become convex, as shown in FIG. 6B. In another embodiment, the filled seam 606 is underfilled with filler material 608 and becomes concave.

Figure 6C:
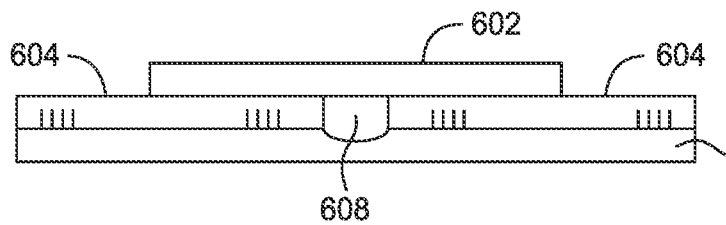
Figure 6D:
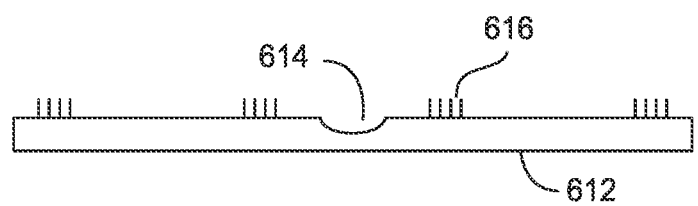
Figure 6E:
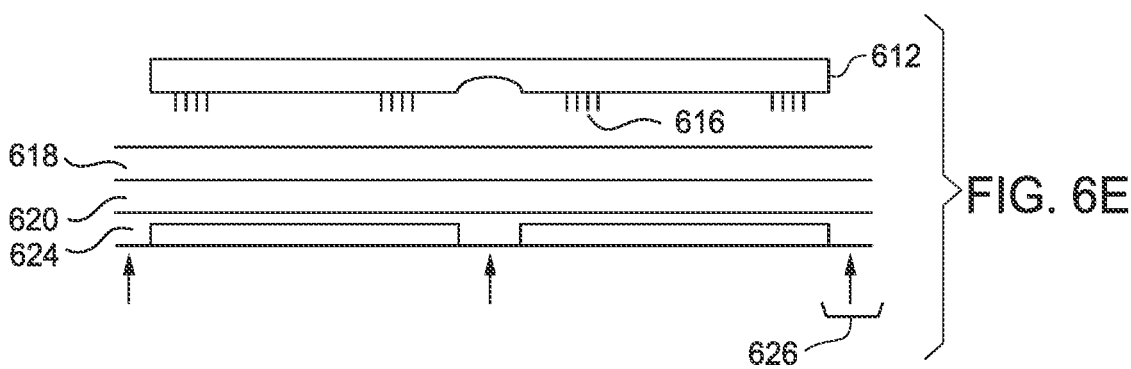
Figure 6F:
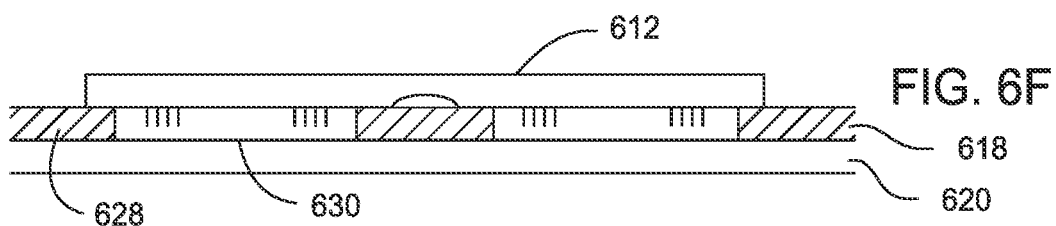

As shown in FIG. 6C, a stamp material 610 is contacted by the masters 604 to form a stamp 612. As shown in FIG. 6D, the stamp 612 is a negative pattern of the masters 604. As such, the stamp 612 includes a concave portion 614 at the position corresponding to the convex seam 606 and negative features 616. The stamp 612 is then used to pattern a photoresist material 618 which is deposited over a substrate 620. As shown in FIG. 6E, a mask 624 is positioned between the stamp 612 and a UV light source 626. In operation, the mask 624 prevents UV light from reaching the portions, shown as uncured portions 630, of the photoresist material 618 that will be imprinted with the features 616. The unmasked portions of the photoresist material 618 are cured, shown as cured portions 628. The cured portions 628 correspond to the areas of the seam 606 and periphery. The stamp 612 then imprints the uncured portions 630 of the photoresist material 618 while the cured portions 628 are not imprinted, as shown in FIG. 6F, to form a final product 622, such as a large area substrate, without a seam.

The stamp material 610 is generally any suitable material. In one example, the stamp material 610 is a PDMS material. The photoresist material 618 is generally any suitable photoresist material. The substrate 620 is generally any suitable substrate material, including but not limited to, glass, PMMA, and polycarbonate.

In another embodiment, the seam 606 is overfilled with a filler material, such as a polymer, and a high elasticity stamp material 610 is used. Further embodiments also contemplate using a maskless direct write laser system to cure the seam 606 and periphery regions before imprint. For example, the maskless direct write laser system is used to cure the seam 606 and periphery regions before the stamp 612 imprints the uncured portions 630 of the photoresist material 618. Additionally, the maskless direct write laser system can be used to cure the rest of the photoresist material 618 after the imprinting has occurred.

The disclosed methods and apparatus are beneficially used to pattern nanoscale features on large area substrates, such as 300 nanometer (nm) or greater display devices, with reduced or eliminated patterning issues at the seams and periphery. For example, the disclosed methods and apparatus can be used imprint a display device with nanofeatures, such as 100 nm features or 50 nm features, with reduced or eliminated patterning issues at the seams and periphery. The disclosed methods and apparatus are useful to pattern Liquid Crystal Displays (LCDs), Light Guide Plates (LGPs), Light Field Plates (LFPs), and Wire Grid Polarizers (WGPs), in addition to other display devices and other optical elements or films for other applications including automotive applications, or augmented reality or virtual reality headsets or smart windows. By reducing or eliminating the patterning irregularities at the seams and periphery, the functionality of the optical device is generally improved. For example, in an LGP, reducing or eliminating the irregularities at the seam and periphery will reduce the light loss from the device. In an LCD, reducing or eliminating the irregularities at the seam and periphery will improve the quality of the projected image from the display and viewers will not see the patterned seams in the image being projected.

While the foregoing is directed to embodiments of the present disclosure, other and further embodiments of the disclosure may be devised without departing from the basic scope thereof, and the scope thereof is determined by the claims that follow.

What is claimed is:

1. An imprint lithography method, comprising:
   providing a plurality of masters disposed on a backing plate, wherein
   the plurality of masters includes a first master and a second master, and
   the plurality of masters includes a seam located between the first master and the second master; and
   imprinting a stamp material comprising cured portions and uncured portions with the plurality of masters to form features in the uncured portions of the stamp material, wherein the cured portions of the stamp material comprise a periphery of the stamp material.

2. The method of claim 1, further comprising directing ultraviolet light from an ultraviolet light source at the stamp material to form the cured portions and uncured portions of the stamp material.

3. The method of claim 2, wherein a mask is positioned between the ultraviolet light source and the stamp material when the ultraviolet light is directed at the stamp material.

4. The method of claim 2, wherein the plurality of masters are positioned between the ultraviolet light source and the stamp material when the ultraviolet light is directed at the stamp material.

5. The method of claim 4, wherein the backing plate is transparent to the ultraviolet light directed at the stamp material.

6. The method of claim 2, further comprising:
   directing additional ultraviolet light from the ultraviolet light source at the stamp material having the cured portions and uncured portions to cure the uncured portions of the stamp material, wherein the additional ultraviolet light is directed at the stamp material after the stamp material is imprinted with the plurality of masters.

7. The method of claim 6, wherein the additional ultraviolet light cures all of the uncured portions of the stamp material.

8. The method of claim 1, wherein the cured portions further comprise portions of the stamp material directly underlying the seam between the first master and the second master when the stamp material is imprinted by the plurality of masters.

9. The method of claim 1, further comprising:
   curing the uncured portions to form a stamp after the stamp material is imprinted with the plurality of masters;
   imprinting a photoresist material on a substrate with the stamp; and
   removing the stamp from the imprinted photoresist material to form a patterned final product.

10. An imprint lithography method, comprising:
    positioning a plurality of masters disposed on a backing plate between an ultraviolet light source and a stamp material; and
    directing ultraviolet light from the ultraviolet light source at the stamp material to form cured portions and uncured portions of the stamp material, wherein the cured portions of the stamp material comprise a periphery of the stamp material and the plurality of masters are spaced apart from the stamp material and located between the ultraviolet light source and the stamp material when the ultraviolet light is directed at the stamp material.

11. The method of claim 10, further comprising imprinting the stamp material with the plurality of masters to form features in the uncured portions of the stamp material.

12. The method of claim 10, wherein the backing plate is transparent to the ultraviolet light directed at the stamp material.

13. The method of claim 10, wherein
the plurality of masters includes a first master and a second master,
the plurality of masters includes a seam located between the first master and the second master, and
directing the ultraviolet light includes directing ultraviolet light through the seam to form a first cured portion of the cured portions.

14. The method of claim 13, wherein
the first cured portion includes a top surface, and
directing the ultraviolet light through the seam comprises directing ultraviolet light at angles other than perpendicular to the top surface.

15. The method of claim 13, wherein the first cured portion includes an overlapping region directly underlying the first master when the first cured portion is formed.

16. The method of claim 13, wherein
the first master is spaced apart from the second master by a first distance in a first direction,
the first cured portion extends in the first direction for a second distance, and
the second distance is greater than the first distance.

17. An imprint lithography method, comprising:
directing ultraviolet light from an ultraviolet light source at a stamp material to form cured portions and uncured portions of the stamp material, wherein the cured portions of the stamp material comprise a periphery of the stamp material; and
imprinting the stamp material including the cured portions and the uncured portions with a plurality of masters to form features in the uncured portions of the stamp material.

18. The method of claim 17, further comprising:
directing additional ultraviolet light from the ultraviolet light source at the stamp material having the cured portions and uncured portions to cure the uncured portions of the stamp material, wherein the additional ultraviolet light is directed at the stamp material after the stamp material is imprinted with the plurality of masters.

19. The method of claim 18, wherein the additional ultraviolet light cures all of the uncured portions of the stamp material.

20. The method of claim 17, further comprising:
curing the uncured portions to form a stamp after the stamp material is imprinted with the plurality of masters;
imprinting a photoresist material on a substrate with the stamp; and
removing the stamp from the imprinted photoresist material to form a patterned final product.

* * * * *